US005388162A

United States Patent [19]

Sohn

[11] Patent Number: 5,388,162

[45] Date of Patent: Feb. 7, 1995

[54] SOUND INNOVATION SPEAKER SYSTEM

[76] Inventor: Tong-Hoon Sohn, #A-1011, Gongzak Apt., Yoido, Seoul 150-010, Rep. of Korea

[21] Appl. No.: 910,735

[22] Filed: Jul. 8, 1992

[30] Foreign Application Priority Data

Jul. 9, 1991 [KR] Rep. of Korea .................. 10-445[U]
Oct. 7, 1991 [KR] Rep. of Korea .................. 16-445[U]
Oct. 7, 1991 [KR] Rep. of Korea .................. 16-446[U]

[51] Int. Cl.[6] ........................ H04R 25/00; H05K 5/00

[52] U.S. Cl. .................................... 381/160; 385/158; 385/90; 385/188; 385/204; 385/205; 181/146; 181/151

[58] Field of Search ............... 381/158, 188, 204, 205, 381/90; 181/146, 151, 199, 153

[56] References Cited

U.S. PATENT DOCUMENTS 2,463,762 11/1941 Giannini .............................. 381/158
3,076,520 5/1959 Farwell .
3,477,540 11/1969 Rizo-Patrone R. ................. 381/158
4,805,221 2/1989 Quaas ................................. 381/188
4,967,871 11/1990 Komatsubara ...................... 381/188
5,111,509 5/1992 Takeuchi et al. ................... 381/205

*Primary Examiner*—Curtis Kuntz
*Assistant Examiner*—Sinh Tran
*Attorney, Agent, or Firm*—Robert E. Bushnell

[57] ABSTRACT

A speaker system designed to use wider resonant sound waves by two conventional speakers which are symmetrically and oppositely disposed to face one another along a co-axis on which both axes of the cone paper vibrator of the speakers are aligned. A sponge like sound wave absorbing material with cone-shaped recesses may be disposed in between the speaker and spherical speaker case.

26 Claims, 3 Drawing Sheets

SOUND INNOVATION SPEAKER SYSTEM

BACKGROUND OF THE INVENTION

1. Field of the Invention

The present invention relates to acoustical speaker systems, and more particularly, to manipulations of the sound waves reproduced by acoustical speaker systems.

2. Discussion of the Background Art

The use of quality loud speaker systems in both home and business is often limited to the compound use of the speakers, sound reflectors for the speakers, avoidance of absorption of the back sound wave from the speakers, and the unbiasing the vibrator of the speakers by blowing air.

A conventional speaker generally contains no sound wave absorbing materials to decrease the sound wave back pressure to the cone paper vibrator which is reflected by its housing or case. A conventional conic paper vibrator of a speaker is more or less reluctant to vibrate freely because it is entirely trapped by both the damper and the edge of the conic paper forming the vibrator, and also by a biasing system enabling air passage.

Mostly, conventional speaker system designs have addressed the process of fine quality sound reproduction; U.S. Pat. No. 4,595,801 issued 17 Jun. 1986, however suggested a coupled dual cone velocity driver speaker with two cone vibrators, but with one voice coil and bobbin. Another system suggested in Japanese Utility Model No. HEI2-12799 issued Apr. 10, 1990, addressed the prevention of magnetic flux leakage.

SUMMARY OF THE INVENTION

It is therefore, a general object of this invention to provide a coupled speaker system with two conventional speaker units that are symmetrically and oppositely coupled together to face with one another along an imaginary central axis in order to resonantly compound two sound waves ideally.

It is a still more specific object to provide a multi-coupled speaker system with two low, two middle, and two high frequency range conventional speaker units that are symmetrically and oppositely coupled in a configuration of low and low, middle and middle, and high frequency range speaker units, respectively, and each of these three pairs of symmetrically and oppositely coupled speakers being arranged in either parallel or in series configurations.

It is a yet more specific object to provide sound reflectors for coupled speaker systems.

It is still yet another object to provide a speaker system with a back sound wave absorber disposed between the vibrator and the enclosure.

It is a further another object to provide a speaker system with an approximately equal, substantially constant distance between the enclosure for a speaker and the body of the vibrator of that speaker.

It is a still further and important object of this invention to provide a speaker system enabling air breathing to bias the: vibrator unit formed by a vibrator, bobbin, and voice coil.

These and other objects may be achieved with a speaker system constructed using a pair of speaker cases, a pair of speaker units each having a conic vibrator exhibiting a central axis and an aperture, with each of the pair of speaker units positioned within an interior of a corresponding different one of the pair of speaker cases, two ducts extending from an interior to an exterior of corresponding ones of the: speaker cases, and four coupling bars connecting the speaker cases together with the: pair of speaker units being coaxially and symmetrically coupled in spaced-apart, facing opposition with each central axis being coaxially aligned.

DESCRIPTION OF THE DRAWINGS

Other and further advantageous features of the present invention will hereinafter more fully appear in connection with a detailed description of the drawings in which.

DESCRIPTION OF THE PREFERRED EMBODIMENTS

Figure 1:
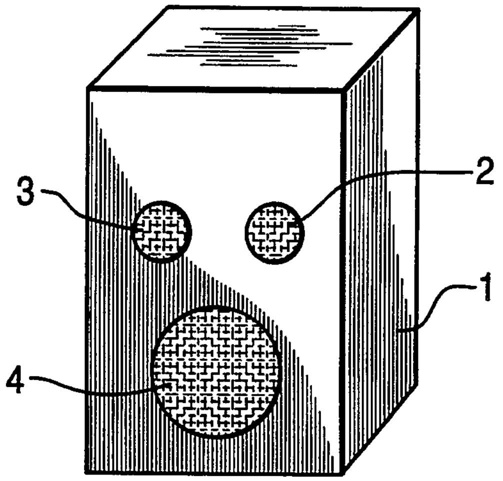
FIG. 1 is a diagrammatic perspective view of a conventional speaker system.

Referring now to FIG. 1, a conventional speaker is generally not made of any sound wave absorbing materials comprising soft sponge or like porosity materials, with cone-shaped holes in order to decrease the sound wave back pressure to the cone paper vibrator which is reflected by the case. Moreover, a conventional conic paper vibrator of a speaker is more or less reluctant to vibrate freely because it is entirely trapped by both the damper and the edge of the conic vibrator, and also by a biasing system enabling air passage for increasing the forward sound wave power while decreasing backward sound wave power.

Generally, two typical conventional speakers are remotely and separately located relative to an audience that ordinarily is distributed horizontally. In this example, a plane built up by the points which are at same distance from both of the speaker units, is acoustically resonant and generally vertical where it is best location to listen, but where it is unfortunately horizontally narrow. Eventually, in a hall, the very few people among the audience who are seated along the vertical resonant plane could have the privilege of being blessed by reception of the loud and resonant sound which is nearly the same as the original sound emanating from the speaker. In another case however, in a room for example, a listener must be seated at the resonant plane zone in order to have this privilege.

The disadvantage of these two speakers' location is that the vertical resonant plane does not give the privilege to all listeners every where.

The following is a description of the best, presently contemplated mode of carrying out the principles of my invention. This description is made for the purpose of illustrating the general principles of the invention, and is not intended to be taken in a limiting sense. The scope of the invention is therefor, best determined by the appended claims.

Figure 2:
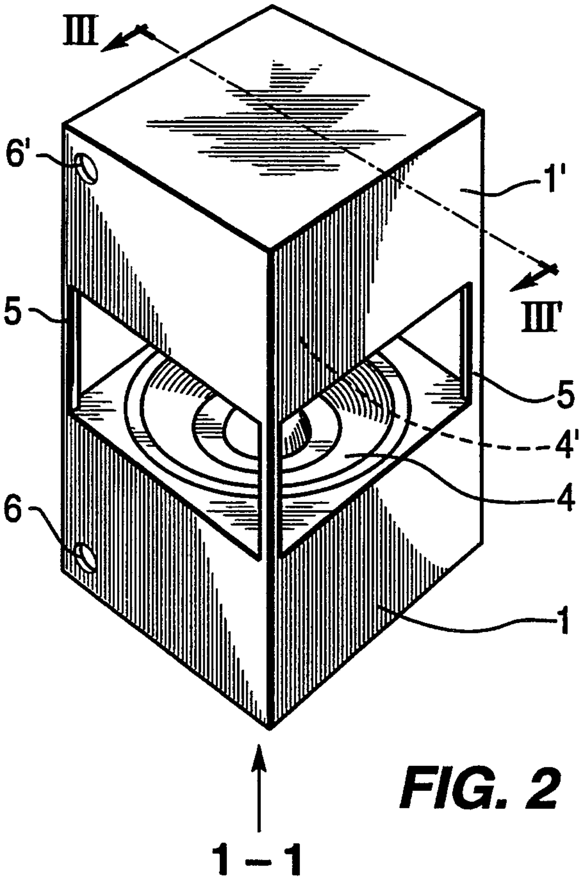
FIG. 2 is a diagrammatic perspective view of one embodiment of the present invention using a coupled speaker system formed by two conventional speakers units.
Figure 3:
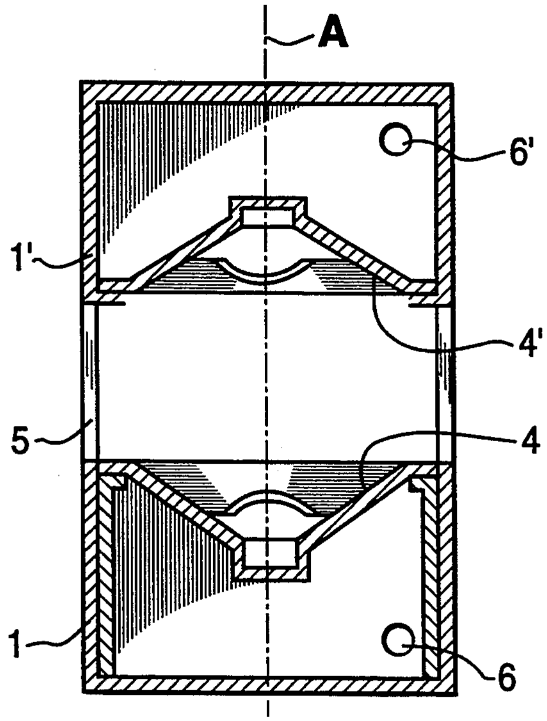
FIG. 3 is a cross sectional view taken along line 3—3′ of FIG. 2.

Referring now to FIGS. 2 and 3, a coupled speaker system 1—1 of the present invention is constructed with two oppositely facing and symmetrically coupled conventional speaker units 4, 4' held spaced apart by the coupling bars 5. The axes of their conic-shaped vibrator paper (not shown in the figures) of speaker units 4, are coaxially located and aligned on a co-axis 4. Ducts 6, 6' are located on a side of the speaker enclosure 1, 1' of the speaker unit 4, 4' III and III' are view lines for the cross section of speaker system 1—1. This cross sectional view is shown in FIG. 3.

In the case where the speaker system 1—1 is vertically positioned, the co-axis A (shown in FIG. 3) is vertical, then the resonant plane (not shown in the figures) of the sound waves of the coupled speaker units 4, 4', which is perpendicular to the co-axis, is horizontal, and wider than that of two speaker units separately installed in a room, or hall, or in the open air. The horizontally resonant plane sound wave travels broadly to all members of an audience around the speaker system 1—1 regardless of whether the audience is assembled in a hall, in the open air, or in a room.

Figure 4:
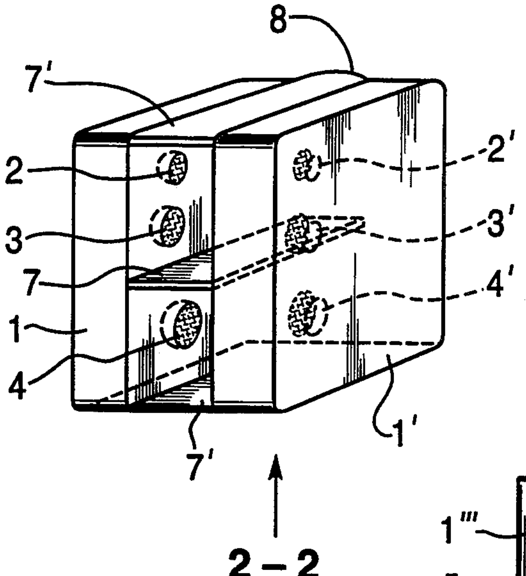
FIG. 4 is a diagrammatic perspective view of an embodiment of the present invention with three pairs of speakers coupled in parallel.

In the FIG. 4, a parallel multi-speaker system 2—2 which is coupled by multi-speaker enclosures 1, 1' comprising high, middle, and low frequency range speakers 2, 3, 4 and 2', 3' 4' respectively, where each range of frequency speakers 2, 2'; 3, 3'; 4, 4' are matched in frequency characteristics, and are coupled together in parallel, along different co-axes (not shown in the figure) by reflecting walls 7, 7', 7'' and reflector 8. In one embodiment reflector 7 separates the pair of lower frequency range speakers 4, 4' from the pairs of high and middle frequency range speakers 2, 2' and 3, 3'. In effect, in that embodiment, spaced apart reflecting walls 7, 7', 7'' and reflector 8 form two adjoining chambers for speaker units 4, 4' and for 2, 2' and 3, 3' respectively, separated by reflecting wall 7, with reflector 8 closing one end of both chambers, while reflecting walls 7' and 7, and 7'' and 7 define the apertures of these two chambers. Separating and reflecting walls 7, 7', 7'' and reflector 8 could, in an alternative embodiment, be replaced by connecting bars (not shown).

Figure 5:
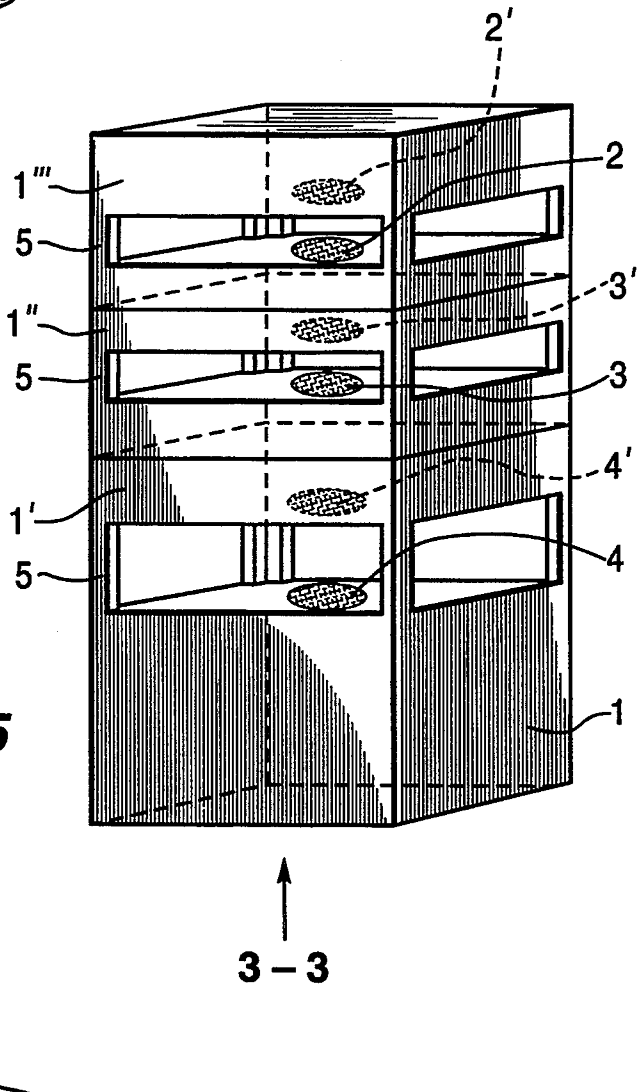
FIG. 5 is a diagrammatic perspective view of another embodiment of the present invention with three pairs of speakers coupled in series.

In the embodiment shown in FIG. 5, a series multi-speaker system 3—3 may be constructed, for example, with the speaker enclosures 1, 1', 1'', 1''' connected by connecting bars 5. Enclosure 1 contains a low frequency range speaker unit 4; enclosure 1' contains a low frequency range speaker unit 4' and middle frequency range speaker unit 3; enclosure 1'' contains a middle frequency range speaker unit 3' and high frequency range speaker unit 2; and enclosure 1''' contains only high frequency range speaker unit 2'. Each pair of oppositely facing speakers 2, 2'; 3, 3'; and 4, 4' may be aligned along their respective co-axes. Alternatively, all six speaker units could be aligned along a single co-axis extending through the imaginary axes of each of the conic vibrators.

Figure 6:
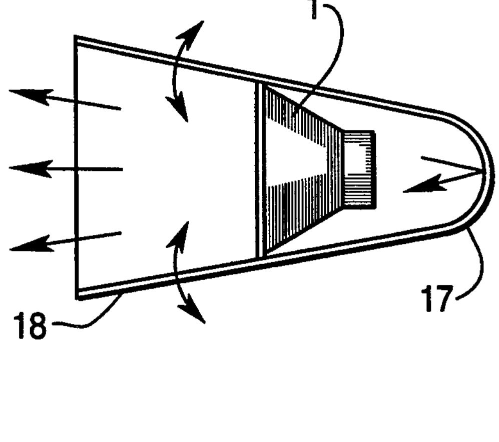
FIG. 6 is a diagrammatic cross sectional view of a parabolic channel reflector with a conventional speaker.

A variable angle parabolic channel-shaped reflector such as the variable parabolic-shape reflector 18 in FIG. 6, could be installed in this series multi-speaker system 3—3.

Figure 7:
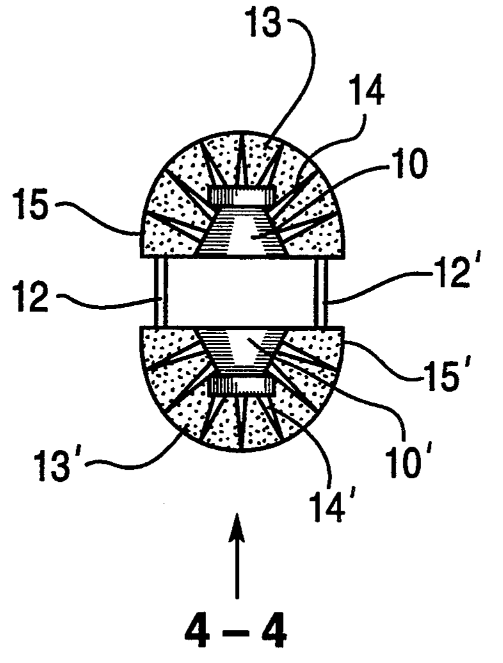
FIG. 7 is a cross sectional view of a coupled speaker system constructed with an equidistance enclosure and sound absorbing materials perforated by cone-shaped holes.
Figure 8:
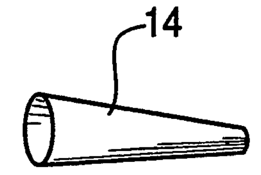
FIG. 8 is a perspective detailed view of a cone shaped hole of the type shown in FIG. 7.

In FIG. 7, the coupled speaker system 4—4 may be constructed with two conventional speaker units 10, 10' coupled together symmetrically and positioned to oppositely face one another along a co-axis of speakers 10, 10' held spaced apart by spaces 12, 12'. Except for their open apertures, both speakers 10, 10' are encased in spherical cases 15, 15', respectively. The sound wave absorbing materials 13, 13' perforated with cone-shaped holes 14, 14' extending between the enclosure 15 and speaker unit 10, have a sponge like porosity materials. The shapes of cone-shaped holes 14 are shown enlarged in FIG. 8. Also, the distances between the speakers 10, 10' and their spherical cases 15, 15' that is, the lengths of the conic recesses, or holes 14, 14', are substantially the same in length because the cases 15, 15' are made in a generally spherical-shape. In the embodiment of FIG. 7, a sound wave generated by speaker 10 spreads forward (i.e., toward speaker 10') and backward. The backward sound wave will be attenuated and gradually fade, by the absorbing materials 13 (and 13') and their cone-shaped recesses 14 (and 14'). The remainder of the sound wave which has not yet been absorbed, will be reflected back to the speaker unit 10 and will homogeneously influence the speaker unit 10 because the travelling distances between spherical cases 15, 15' are mostly the same. In other words, in an ideal embodiment, every point on the exterior surfaces of speakers 10, 10' are separated by, and equidistantly spaced from, the inner periphery of spherical cases 15, 15', respectively.

Figure 9:
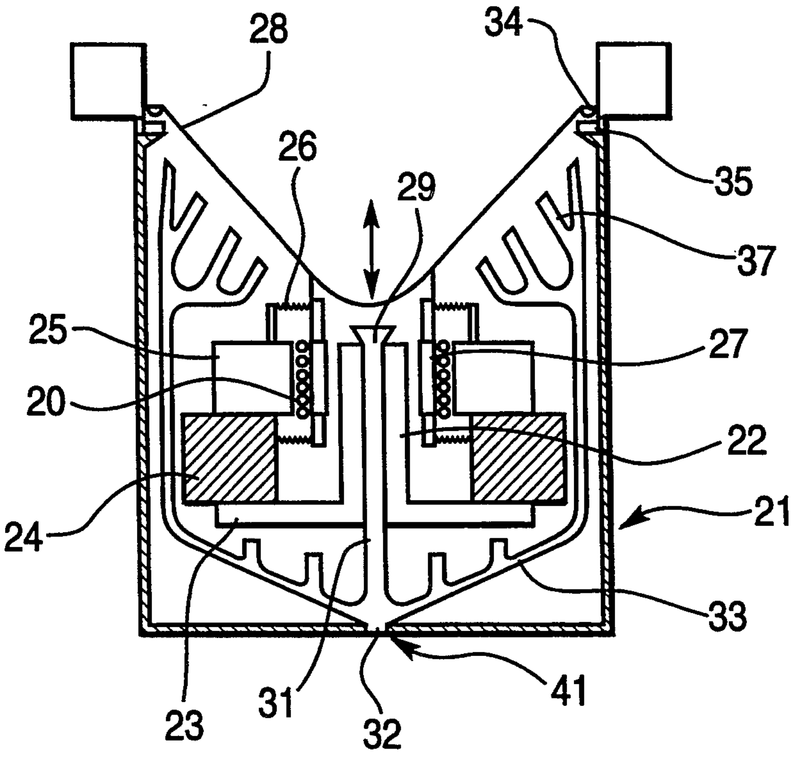
FIG. 9 is a cross sectional view of a speaker system of the present invention constructed to enable air blowing.

Turning now to FIG. 9, the speaker assembly 21 is shown with a voice coil 20 arranged symmetrically about a center pole 22, yoke 23, permanent magnet 24, plate 25, damper 26 and bobbin 27 driving a conic-shaped vibrating medium 28 having the underside of its outer circumference supporting a soft gasket 34 made of a resilient, pliable material mounted upon a receiving soft gasket 35 made of a resilient, pliable material positioned along the inner periphery of a speaker housing 45. Air, or other gaseous phase substance may be introduced via air inlet 32 to flow through air paths 31, 33 extending between inlet 32 and through a solid, vibration free material 47 interposed between interior surfaces of housing 45 and the assembly of voice coil 20, center pole 22, yoke 23, magnet 24, plate 25, damper 26, bobbin 27 and vibrator medium 28. Inner air path 31 extends between air inlet 32 and air outlet 29, with air outlet 29 symmetrically positioned between the imaginary apex of the conic surface formed by vibrator or medium 28. The distal ends of the plurality of air paths 33 disposed outwardly from the central axis of speaker unit 21 terminate in arrays of air branch paths 37 adjacent to, but spaced apart by medium 47 from vibrator medium 28. Consequently, as vibrator medium 28 is driven at acoustic frequencies by voice coil 20 and the associated center pole 22, yoke 23, magnet 24, plate 25 and bobbin 27, gaseous phase atmospheric air 41 introduced under moderate pressure into air paths 31, 33 via air inlet 32 biases vibrator media 28 somewhat outwardly away from voice coil 20 and center pole 22. The symmetric disposition of the air branch paths 37 assures a uniformity in the application of the air bias.

In the embodiment shown in FIG. 9, the cone (e.g., constructed of paper) vibrator edge (not shown in the figure) is cut like a ladder off along the circumferential rim of the speaker frame (not shown in the figure), in order to decrease the reluctancy. Also, the damper 26 is, as the edge, cut for the same purpose.

In order to bias the vibrating unit of cone paper vibrator 28, its edge (not shown in the figure), bobbin 27 with voice coil 20 wound thereon, and damper 26, are outwardly subjected to a flow of air 41 introduced through the air inlet 32, and along, air paths 31 and 33, air outlet 29, and air path branches 37 from an air blower (not shown in the figure). A biasing effect that is attributable to the pressure of air introduced into passages 31, 33 increases the forward sound wave power and decreases the backward sound wave power. Air passages 31, 33 and 37 are formed in a vibration free solid material interposed between conic-shaped vibrator 28 and the walls of speaker unit 21. Soft gaskets 34, 35 of pliable materials, are interposed between the under circumferential outermost rim of vibrator 28 and the inner, upper periphery of the enclosure of speaker unit 21.

REFERENCE CHARACTERS

In FIG. 1

1: Conventional Speaker Enclosure
2: High Frequency Range Speaker Unit
3: Middle Frequency Range Speaker Unit
4: Low Frequency Range Speaker Unit In FIGS. 2 & 3

1—1: Coupled Speaker System of the Present Invention
4, 4': Conventional Speaker Units
5: Coupling Bars
1, 1': Speaker Enclosures
6, 6': Ducts In FIG. 4

2—2: Parallel Multi-speaker System
1, 1': Conventional Speaker Enclosures
2, 2': High Frequency Range Speaker Units
3, 3': Middle Frequency Range Speaker Units
4, 4': Low Frequency Range Speaker Units
7, 7' & 7'': Separating and Reflecting Wall
8: Reflector In FIG. 5

3—3: Series Multi-speaker system
1, 1', 1'', 1''': Series Coupled Speaker Enclosures
2, 2': High Frequency Range Speaker Units
3, 3': Middle Frequency Range Speaker Units
4, 4': Low Frequency Range Speaker Units
5: Coupling Bars In FIG. 6

1: Conventional Speaker Unit
17: Crest of the reflector
18: Variable Angle Parabolic Reflector In FIG. 7

4—4: Coupled Speaker System
10, 10': Conventional Speaker Units
12, 12': Coupling Bars
13, 13': Sound Wave Absorbing Materials
14, 14': Cone-Shaped Air Holes
15, 15': Spherical Enclosures In FIG. 8

14: Cone-Shaped Air Holes

In FIG. 9

20: Voice Coil
21: Speaker Unit
22: Center Pole
23: Yoke
24: Magnet
25: Plate
26: Damper
27: Bobbin
28: Cone-Shaped Vibrator
29: Air Outlet
31, 33: Air Path
32: Air Inlet
34: Soft Gasket
35: Soft Gasket
37: Air Branch Path
41: Breezing Air

What is claimed is:

1. A speaker system, comprising:

a first pair of speaker cases;

a first pair of speaker units each having a conic vibrator exhibiting a central axis and an aperture, each of said first pair of speaker units being positioned within an interior of a corresponding different one of said first pair of speaker cases;

sound wave absorbing material perforated with cone-shaped holes extending radially outwardly from corresponding ones of said first pair of speaker units; and means for connecting said speaker cases together with said first pair of speaker units being coaxially and symmetrically coupled in spaced-apart, facing opposition with each central axis being coaxially aligned.

2. The speaker system as claimed in claim 1, further comprising:

a second pair of speaker units each positioned within said interior of said corresponding different one of said first pair of speaker cases, said second pair of speaker units being coaxially and symmetrically coupled in spaced-apart, facing opposition; and a third pair of speaker units each positioned within said interior of said corresponding different one of said first pair of speaker cases, said third pair of speaker units being coaxially and symmetrically coupled in spaced-apart, facing opposition;

wherein said first pair of speaker units exhibit a high frequency range, said second pair of speaker units exhibit a middle frequency range, and said third pair of speaker units exhibit a low frequency range.

3. A speaker system according to claim 2, wherein said means for connecting comprise:

reflecting walls coupling said first pair of speaker cases; and a reflector separating said third pair of speaker units from said first and second pairs of speaker units.

4. The speaker system according to claim 2, wherein said means for connecting comprise:

a plurality of spaced-apart reflecting walls positioned between and maintaining said first pair of speaker cases, said first pair of speaker units opening into a first of a plurality of chambers and said third pair of speaker units opening into a different one of said plurality of chambers; and a reflector disposed transversely to said plurality of reflecting walls, to close one end of each of said plurality of chambers.

5. A speaker system according to claim 2, further comprising:

said first pair of speaker cases comprising a pair of hemispherical enclosures exposing said apertures of said first pair of speaker units, said sound wave absorbing material being disposed in between the first pair of speaker units and said hemispherical enclosures of said first pair of speaker cases.

6. A speaker system according to claim 1, further comprising:

a second pair of speaker units each having a conic vibrator exhibiting a second axis and an aperture;

a third pair of speaker units each having a conic vibrator exhibiting a third axis and an aperture;

a second pair of speaker cases; and a first one of said second pair of speaker units positioned within a second one of said first pair of speaker cases;

a second one of said second pair of speaker units positioned within a first one of said second pair of speaker cases, with said second pair of speaker units being coaxially and symmetrically coupled in spaced-apart, facing opposition along said second axis;

a first one of said third pair of speaker units positioned within said first one of said second pair of speaker cases;

a second one of said third pair of speaker units positioned within a second one of said second pair of speaker cases, with said third pair of speaker units being coaxially and symmetrically coupled in spaced-apart, facing opposition along said third axis.

7. A speaker system according to claim 1, wherein each of said first pair of speaker units comprises a variable angle, parabolic channel-shaped reflector.

8. A speaker system comprising:

a first pair of speaker cases;

a first pair of speaker units each having a conic vibrator exhibiting a central axis and an aperture, each of said first pair of speaker units being positioned within an interior of a corresponding different one of said first pair of speaker cases;

means for connecting said speaker cases together with said first pair of speaker units being coaxially and symmetrically coupled in spaced-apart, facing opposition with each central axis being coaxially aligned;

sponge-like sound wave absorbing material disposed between each of said first pair of speaker units and said corresponding different one of said first pair of speaker cases with cone-shaped holes in said material extending radially between each of said first pair of speaker units and said corresponding different one said first pair of speaker cases.

9. A speaker system according to claim 1, further comprising:

said first pair of speaker cases comprising a pair of hemispherical enclosures exposing said apertures of said first pair of speaker units, said sound wave absorbing material being disposed in between the first pair of speaker units and said hemispherical enclosures of said first pair of speaker cases.

10. A speaker system according to claim 2, further comprising said sound wave absorbing material disposed between each of said first pair of speaker cases and a corresponding one of said second pair of speaker units with said cone-shaped holes in said sound wave absorbing material extending radially between each of said first pair of speaker cases and said corresponding one of said second pair of speaker units.

11. A speaker system according to claim 2, further comprising said sound wave absorbing material disposed between each of said first pair of speaker cases and a corresponding one of said third pair of speaker units with said cone-shaped holes in said sound wave absorbing material extending radially between each of said first pair of speaker cases and said corresponding one of said third pair of speaker units.

12. A speaker system, comprising:

a conic vibrator;

an air inlet;

a plurality of air conduits extending from said air inlet toward said conic vibrator;

an air outlet connected by said plurality of air conduits to said air inlet;

air path branches extending from outer ones of said plurality of air conduits toward said conic vibrator; and means for imparting vibrations to said conic vibrator in response to audio frequency signals;

whereby said conic vibrator is biased while vibrating in response to said audio frequency signals by air entering through said inlet and said plurality of air conduits, and traveling into said air branches and passing through said air outlet.

13. A speaker system according to claim 12, further comprised of a damper and a ladder-like portion, said ladder-like portion being positioned on a frame along a circumference of said conic vibrator.

14. The speaker system of claim 1, wherein each of said first pair of speaker units comprises:

an air inlet;

a plurality of air path branches communicating with and extending outwardly from said air inlet toward said conic vibrator;

an air outlet connected by one of said air path branches to said air inlet; and said conic vibrator being disposed between said plurality of air path branches, whereby said conic vibrator is biased while vibrating, by air flowing through said air inlet, air path branches, and air outlet.

15. The speaker system of claim 2, wherein each of said second pair of speaker units comprises:

an air inlet;

a plurality of air path branches; communicating with and extending outwardly from said air inlet toward said conic vibrator;

an air outlet connected by one of said air path branches to said air inlet; and said conic vibrator being disposed between said plurality of air path branches, said conic vibrator being biased while vibrating, by air flowing through said air inlet, air path branches, and air outlet.

16. The speaker system of claim 2, wherein each of said third pair of speaker units comprises:

an air inlet;

a plurality of air path branches communicating with and extending outwardly from said air inlet toward said conic vibrator;

an air outlet connected by one of said air path branches to said air inlet; and said conic vibrator being disposed between said plurality of air path branches, said conic vibrator being biased while vibrating, by air flowing through said air inlet, air path branches, and air outlet.

17. The speaker system of claim 2, further comprised of said second pair of speaker units being symmetrically disposed along a second axis and said third pair of speaker units being symmetrically disposed along a third axis, said central axis, said second axis and said third axis being substantially parallel and spaced apart.

18. The speaker system of claim 4, further comprised of said second pair of speaker units being symmetrically disposed along a second axis and said third pair of speaker units being symmetrically disposed along a third axis, said central axis, said second axis and said third axis being substantially parallel and spaced apart.

19. The speaker system of claim 6, further comprised of said central axis, said second axis and said third axis being coaxially aligned.

20. A speaker system comprising:

a hemispherical housing;

a medium supported by said hemispherical housing to vibrate;

driving means symmetrically disposed within said hemispherical housing, for imparting sonic vibrations to said medium in response to audio frequency signals; and means disposed between said driving means and the interior of said hemispherical housing, constructed of a resilient material perforated by a plurality of discrete conic recesses extending radially between said driving means and said hemispherical housing, for absorbing sound waves emanating toward said interior from said medium.

21. A speaker system comprising:

a pair of speaker cases;

a plurality of speaker units, said plurality of speaker units being separated into pairs of speaker units, each speaker unit having a conic vibrator exhibiting a central axis and an aperture, a first speaker from each pair being positioned within an interior of a first one of said pair of speaker cases, and a second speaker unit from each pair being positioned within an interior of a second one of said pair of speaker cases;

sound wave absorbing material perforated with cone-shaped holes, said cone-shaped holes extending radially outwardly from corresponding ones of said plurality of speaker units; and means for connecting said pair of speaker cases such that central axes of each pair of speaker units are coaxially and symmetrically coupled in spaced-apart opposition.

22. The speaker system as claimed in claim 21, wherein each of said plurality of speaker units comprises:

an air inlet;

a plurality of air conduits extending from said air inlet towards said conic vibrator;

an air outlet connected by said plurality of air conduits to said air inlet;

air path branches extending from outer ones of said plurality of air conduits toward said conic vibrator; and means for imparting vibrations to said conic vibrator in response to audio frequency signals, said conic vibrator being biased while vibrating by air entering through said air inlet and said plurality of air conduits, said air traveling into said air branches and passing through said air outlet.

23. The speaker system as claimed in claim 21, wherein said means for connecting said pair of speaker cases further comprises:

a plurality of reflecting wails positioned between and maintaining each of said pair of speaker cases; and a reflector disposed transversely to said plurality of reflecting walls.

24. A speaker system, comprising:

a first pair of speaker cases;

a first pair of speaker units each having a conic vibrator exhibiting a central axis and an aperture, each of said first pair of speaker units being positioned within an interior of a corresponding different one of said first pair of speaker cases;

a second pair of speaker units each having a conic vibrator exhibiting a second axis and an aperture;

a third pair of speaker units each having a conic vibrator exhibiting a third axis and an aperture;

a second pair of speaker cases;

a first one of said second pair of speaker units positioned within a second one of said first pair of speaker cases;

a second one of said second pair of speaker units positioned within a first one of said second pair of speaker cases, with said second pair of speaker units being coaxially and symmetrically coupled in spaced-apart, facing opposition along said second axis;

a first one of said third pair of speaker units positioned within said first one of said second pair of speaker cases;

a second one of said third pair of speaker units positioned within a second one of said second pair of speaker cases, with said third pair of speaker units being coaxially and symmetrically coupled in spaced-apart, facing opposition along said third axis; and sound wave absorbing material perforated with cone-shaped holes extending radially outwardly from corresponding ones of said first pair, said second pair, and said third pair of speaker units.

25. The speaker system according to claim 5, wherein said means for connecting comprise:

a plurality of spaced-apart reflecting walls positioned between and maintaining said first pair of speaker cases, with said first pair of speaker units opening into a first of a plurality of chambers and said third pair of speaker units opening into a different one of said plurality of chambers; and a reflector disposed transversely to said plurality of reflecting walls, to close one end of each of said plurality of chambers.

26. The speaker system as claimed in claim 24, wherein each speaker unit comprises:

an air inlet;

a plurality of air conduits extending from said air inlet towards said conic vibrator;

an air outlet connected by said plurality of air conduits to said air inlet;

air path branches extending from outer ones of said plurality of air conduits toward said conic vibrator; and means for imparting vibrations to said conic vibrator in response to audio frequency signals, said conic vibrator being biased while vibrating by air entering through said air inlet and said plurality of air conduits, said air traveling into said air branches and passing through said air outlet.

* * * * *